United States Patent [19]
Lee et al.

[11] Patent Number: 5,810,994
[45] Date of Patent: Sep. 22, 1998

[54] METHOD FOR FABRICATING SILICON-ON-INSULATOR DEVICE WAFER

[75] Inventors: Ho Jun Lee; Choong Ki Kim; Chul Hi Han, all of Daejeon, Rep. of Korea

[73] Assignee: Korea Advanced Institute of Science and Technology, Daejeon, Rep. of Korea

[21] Appl. No.: 725,620

[22] Filed: Oct. 3, 1996

Related U.S. Application Data

[62] Division of Ser. No. 556,382, Nov. 13, 1995, abandoned.

[30] Foreign Application Priority Data

Dec. 16, 1994 [KR] Rep. of Korea ................. 1994-34662

[51] Int. Cl.⁶ ......................................................... C25F 3/12
[52] U.S. Cl. ........................ 205/656; 205/660; 205/662; 205/674
[58] Field of Search .................................. 205/656, 674, 205/662, 660

[56] References Cited

U.S. PATENT DOCUMENTS

| | | | |
|---|---|---|---|
| 4,303,482 | 12/1981 | Bühne et al. ...................... | 205/656 X |
| 5,066,610 | 11/1991 | Chen et al. ............................... | 437/83 |
| 5,233,218 | 8/1993 | Miura ....................................... | 257/347 |
| 5,286,671 | 2/1994 | Kurtz et al. ............................... | 437/64 |
| 5,458,735 | 10/1995 | Richter et al. ....................... | 205/656 X |
| 5,529,950 | 6/1996 | Hoenlein et al. .................... | 205/656 X |

FOREIGN PATENT DOCUMENTS 3-153081  7/1991  Japan .

*Primary Examiner*—Donald R. Valentine
*Attorney, Agent, or Firm*—Merchant, Gould, Smith, Edell, Welter & Schmidt

[57] ABSTRACT

A silicon on-insulator device wafer having a very thin monocrystalline film with uniform thickness. It is fabricated by vias technique in which a monocrystalline silicon film on an insulator is etched with a base silicon etching solution in an etch apparatus by applying a vias in such a way that the solution may serve as an anode and the substrate of SOI structure as a cathode. The presence of the insulator generates vacancies in a lower region of the monocrystalline silicon film and electrons in the substrate, so that the lower region charged with the vacancies is not removed by the base silicon etching solution, thereby leaving a highly uniform, thin monocrystalline silicon film.

10 Claims, 6 Drawing Sheets

METHOD FOR FABRICATING SILICON-ON-INSULATOR DEVICE WAFER

This is a Divisional of application Ser. No. 08/556,382, filed Nov. 13, 1995, now abandoned, which application are incorporated herein by reference.

BACKGROUND OF THE INVENTION

1. Field of the Invention

The present invention relates, in general, to a silicon-on-insulator (SOI) device wafer suitable for very large scale integration of circuit and, more particularly, to an SOI device wafer having a silicon thin film with a highly uniform and precise thickness. Also, the present invention is concerned with a method for forming a highly uniform, thin silicon film on an insulator by bias process.

2. Description of the Prior Art

Electronic devices built on SOI device wafers have potentially significant advantages over those on bulk silicon, including a radiation resistance owing to their small active volume, a high degree of integration and reduced parasitic capacitance owing to thorough isolation of the device by the insulator, and the absence of any latch-up phenomenon. Hence, they are extremely useful for very large scale integration of high performance circuitry. For example, it seems highly likely that the memories of one giga DRAM or more, and the electronic devices to be mounted in space crafts or rockets, could be fabricated using SOI wafers.

According to the most recent studies, the qualifications which SOI wafers must have for assurance of superior electrical characteristics are: single crystal silicon thin film with uniform thickness and good crystallinity; quality, thick buried oxide film; and good interface characteristics between the silicon thin film and the buried oxide film. Currently, depending on fabrication methods, SOI device wafers are divided largely into SIMOX (separation of implanted oxygen) wafer, ZMR (zone melting recrystallization) wafer, FIPOS (full isolation by porous oxidized silicon) wafer and bonding wafer. However, none of these is qualified with all three superior electrical characterics. For example, SIMOX wafers have a silicon film of a relatively thin and uniform thickness but the buried oxide film is thin, showing poor interface characteristics therebetween. ZMR wafers have a thick buried oxide film and good interface characteristics, but the buried oxide film is seriously nonuniform in its thickness. Although displaying good interface characteristics, FIPOS wafers are disadvantageous in that the buried oxide film is of poor characteristic and their fabrication processes are intricate. In the case of the bonding wafer, while the silicon thin film, the buried oxide film and the interface therebetween are superior in electrical properties, the silicon thin film becomes quite nonuniform in thickness thereby being formed relatively thick.

SUMMARY OF THE INVENTION

Accordingly, it is a principal object of the present invention to provide a method for fabricating silicon on insulator (SOI) device wafers by bonding and bias techniques which avoids the aforementioned problems associated with the prior art.

It is another object of the present invention to provide an SOI device with superior interface characteristics, a thick, buried oxide layer and a very thin monocrystalline silicon film.

It is a further object of the present invention to provide an SOI device having a monocrystalline thin film which is quite uniform in thickness.

In accordance with one aspect of the present invention, there is provided a bias method for fabricating a silicon on insulator device wafer, comprising the steps of: bonding a non-treated lower silicon wafer with an upper silicon wafer the entire surface of which is coated with an oxide; subjecting said upper silicon wafer to mechanical polishing or chemical etching to several tens of microns or less, to produce a silicon on insulator structure which comprises a silicon film having a thickness of several tens of microns or less, a silicon substrate and a buried oxide layer therebetween; removing a stretch of the silicon film along the brink of said silicon on insulator structure, to expose a circumferential stripe of said buried oxide layer; preparing an etch apparatus comprising an etch vessel, an electrode and a power source, said etch vessel formed by attaching said cut silicon film to the bottom of a [teflon] pipe with a sealing means; contacting a base silicon etching solution only with said silicon film by filling it in said vessel; and etching said silicon film to an appropriate depth by applying a bias through said electrode to said etch apparatus with an anode of said etching solution and a cathode of the substrate of said silicon on insulator structure, so as to leave a uniformly thin monocrystalline silicon film, which is charged with vacancies during the application of a bias.

In accordance with another aspect of the present invention, there is provided a bias method for forming a thin monocrystalline silicon film on an insulator, comprising the steps of: preparing an etch apparatus comprising an etch vessel, an electrode and a power source, said etch vessel formed by attaching a monocrystalline silicon film of an ordinary silicon on insulator device wafer to the bottom of a pipe with a sealing means; contacting a base silicon etching solution with said monocrystalline silicon film in said etch vessel; and etching said monocrystalline silicon film to an appropriate depth by applying a bias through said electrode to said etch apparatus with an anode of said etching solution and a cathode of the substrate of said silicon on insulator device wafer, so as to leave a uniformly thin monocrystalline film, which is charged with vacancies during the application of the bias.

In accordance with a further aspect of the present invention, there is provided a silicon on insulator device wafer, comprising: a non-treated silicon substrate; a buried oxide layer bonded with the upper surface of said silicon substrate; and a circular monocrystalline silicon thin film formed on said buried oxide layer and having a uniform thickness and a diameter less than of said buried oxide layer, a circumferential surface of said buried oxide being exposed along its brink.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1A:
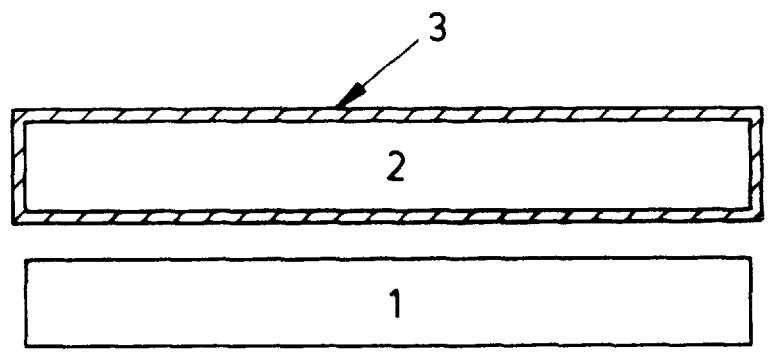
FIGS. 1A through 1F are schematic cross sectional views illustrating a method for fabricating an SOI device wafer by bonding and bias techniques, according to a first embodiment of the present invention.

The application of the preferred embodiments of the present invention is best understood with reference to the accompanying drawings, wherein like reference numerals are used for like and corresponding parts, respectively.

Referring initially to FIG. 1A, there is shown a cross sectional view of a non-treated lower silicon wafer 1 and an upper silicon wafer 2 having a coating of oxide layer 3. The lower silicon wafer 1 may be prepared from a semiconductor material, such as N-type silicon, and is preferably a single crystal structure. For the upper silicon wafer 2 a semiconductor material such as P-type silicon may be used and is preferably a single crystal structure. Both of the lower and the upper silicon wafers have the direction of (100) and are 4 inches thick. In essence, they are commercially available and are well known in the art. The upper silicon 2 is treated so that the oxide layer, which is about 3 to 0.5 microns thick, is thermally grown on the entire surface thereof.

Figure 1B:
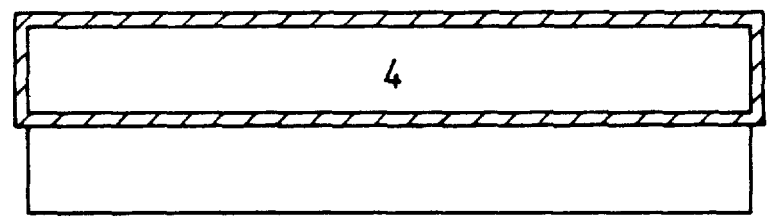

After being boiled in a mixture solution of sulfuric acid and hydrogen peroxide, the two silicon wafers are bonded with each other by taking advantage of a hydrogen bond and then annealed at 1,100° C. for 2 hours in an oxygen ambient, as shown in FIG. 1B.

Figure 1C:
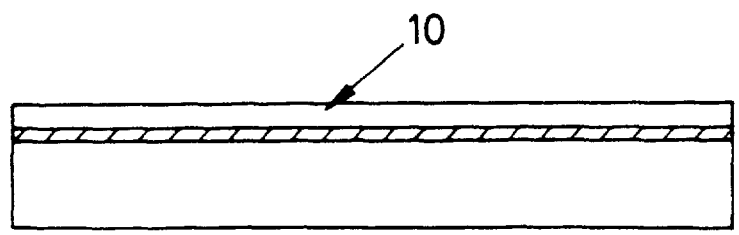

With reference now to FIG. 1C, it can be seen that the exposed surfaces of the oxide layer 3 and the substrate portion 4 of the upper silicon substrate 2 are mechanically polished, leaving a silicon film 10 which is several tens of microns thick and a buried oxide layer 12. Since an accurate thickness of the silicon film 10 is not important at this step as will be discussed shortly, the thickness may be roughly controlled using a micrometer or microscope. Another typical technique for reducing a silicon substrate into several tens of microns or less is an etch using a base silicon etchant such as aqueous KOH solutions or mixture solutions of ethylene diamine, pyrocatechol and water. The knowledge of silicon etch rate of the chemical etchant enables the silicon substrate to remain several tens of microns thick only by controlling etching time. In the present invention, the silicon substrate 10 is etched away by using a 45 wt % KOH solution having a silicon etch rate of about 2 microns/min, at 80° C. for 4 hours, to leave the silicon film 10 about 20 microns thick.

Figure 1D:
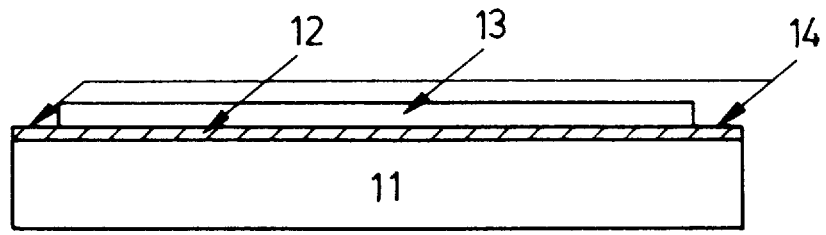

As shown in FIG. 1D, a stretch of the silicon film 10 is taken off at the brink to expose the buried oxide layer 12 in part, which appears circular in the top view. As a result, an SOI device wafer structure consisting of a substrate 11, a buried oxide 12 and a silicon film 13 is obtained. The circumferential stripe 14 of the buried oxide layer 12$i$ about 500 microns to 1 cm wide.

Figure 1E:
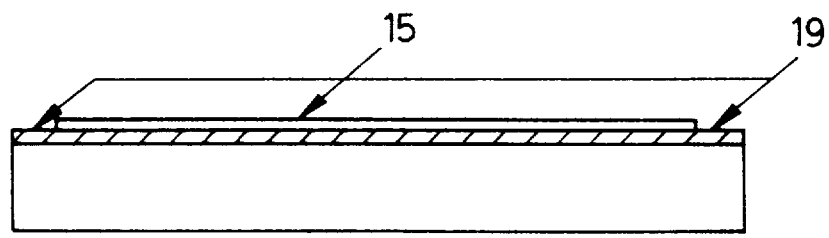
Figure 2:
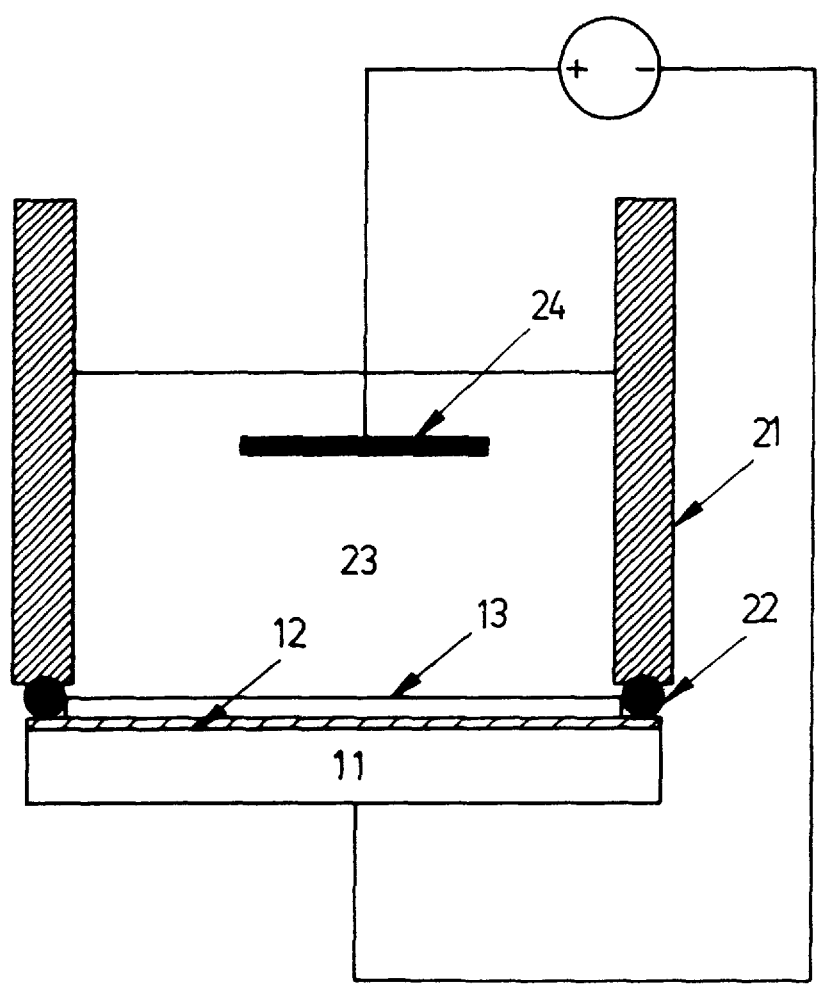
FIG. 2 is a schematic diagram showing an etch apparatus for bias technique according to the present invention.

Thereafter, such SOI device wafer structure is further processed using a bias technique as will be described in connection with FIG. 2. FIG. 2 shows an etch apparatus for the bias technique. As shown in this figure, the etch apparatus comprises a pipe 21, a platinum electrode 24 and a power source. First, the obtained SOI device wafer structure is attached to the bottom of the pipe 21 in such a way that the silicon film 13 is directed upward, and the contact between the SOI wafer and the vessel is sealed with an O-ring 22. Then, the volume formed by the pipe 21 and the silicon film 13 is filled with a base silicon etching solution 23, and a bias voltage is applied through the platinum electrode 24 into the etch apparatus in such a way that the etchant 23 serves as an anode while the substrate 11 becomes a cathode. In this first embodiment of the present invention, a mixture solution of ethylene diamine, pyrocatechol and water which is warmed to 50° C. is adopted as an etchant and a bias of 50 volts is applied. According to this method, the material from the silicon film 13 is etched away to an appropriate depth to produce a very thin silicon film 15 as shown in FIG. 1E. The reason for such thinness will be explained later in connection with FIG. 3.

Figure 3:
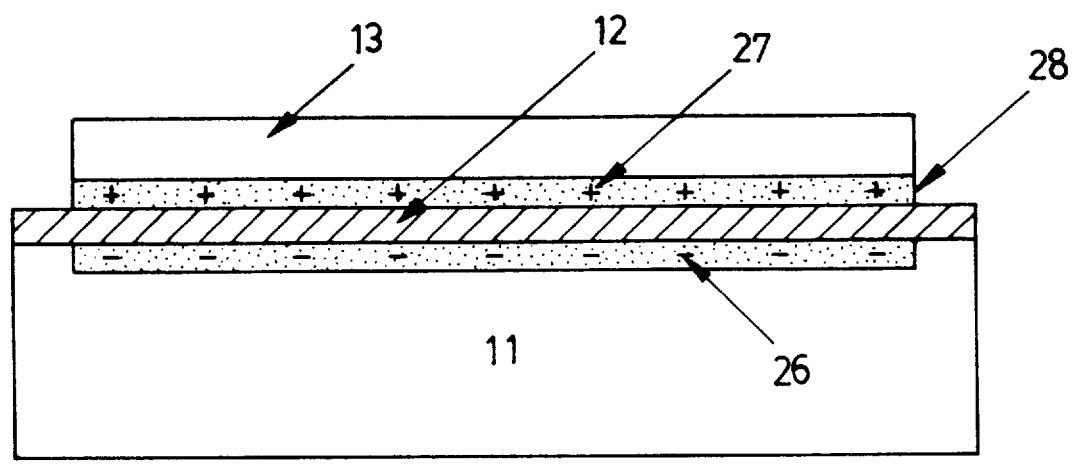
FIG. 3 is a schematic diagram illustrating the principle of the bias technique.

If a bias voltage is applied into the wafer under the same conditions as are shown in FIG. 2, no current flows because of the presence of the buried oxide layer 12, a nonconductor. Hence, as shown in FIG. 3, electrons are charged in an upper portion 26 of the substrate 11 coming into contact with the lower surface of the buried oxide 12 whereas vacancies are charged in a lower portion 28 of the silicon film 13 contacted with the upper surface of the buried oxide 12. The concentration of the charged vacancies is determined by the following formula:

$$D = C \times V/L \qquad [1]$$

wherein D is a concentration of the charged vacancies;

C is a capacitance per area of the oxide layer;

V is a bias voltage; and

L is the Debye length in the silicon film.

Thus, a large enough bias voltage results in increasing the concentration of the charged vacancies so that the vacancy layer 28 in contact with the buried oxide layer 12 is like a silicon layer in which a high density of boron is doped. A high-density boron-doped silicon layer is not etched by base silicon etching solutions. Likewise, the vacancy layer is not removed in the chemical etchant, to produce the silicon film 15 which is very thin. As apparent from the above description, the thickness of the vacancy layer 28 is irrespective of that of the silicon film 10, so that the final silicon thin film 15 (see FIG. 1E) is absolutely uniform in thickness even though the initial silicon film 13 is nonuniform in thickness.

Figure 1F:
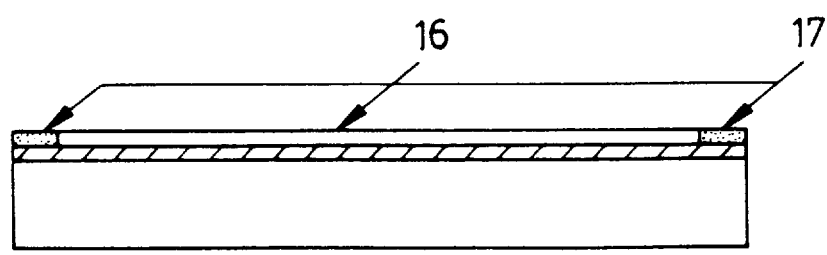

In the case that the silicon thin film of the SOI wafer obtained is too thin, an epitaxial silicon layer can be grown on the wafer to give a desired thickness of a silicon thin film 16, as shown in FIG. 1F. At the moment, because the circular oxide layer is exposed at the brink of the wafer, a polycrystalline silicon film 17 is made circular, on the exposed area of the oxide layer to a width of about 500 microns to 1 cm. In the present invention, an epitaxial silicon layer is grown to about 1 micron thickness.

Figure 4A:
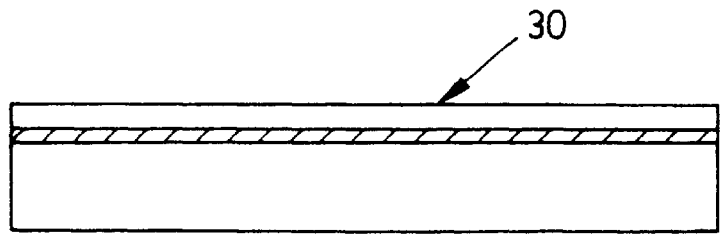
FIGS. 4A through 4D are schematic cross sectional views illustrating a method for forming a highly uniform, thin silicon film by applying the bias technique to an ordinary SOI device wafer, according to a second embodiment of the present invention.
Figure 4B:
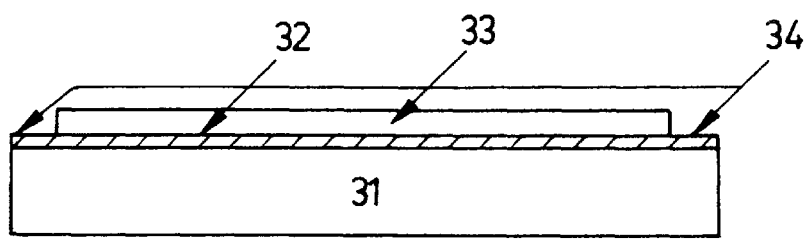

A second method according to the present invention is very similar to the technique described previously and is best described with reference to FIG. 4. FIG. 4A shows an ordinary SOI device wafer structure consisting of a silicon thin film 30, a buried oxide layer 32 and a substrate 31, which is like that of FIG. 1C. As shown in FIG. 4B, a stretch of the silicon film 30 is taken off along its circumference to expose the buried oxide layer 32 in part, which appears circular in the top view. The circular stripe 34 of the buried oxide layer 32 is about 500 microns to 1 cm wide.

Figure 4C:
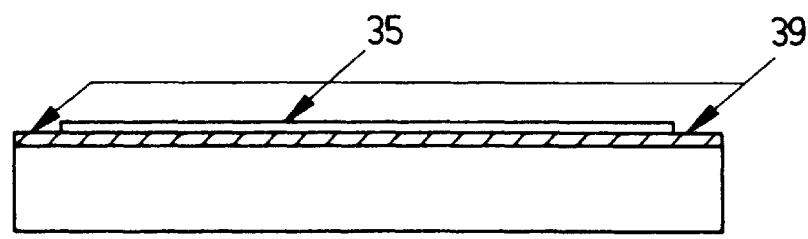

With reference now to FIG. 4C, there is a cross section of the SOI wafer after a bias technique such as that described in FIG. 2 is applied. Likewise, the obtained SOI wafer is attached to the bottom of the pipe 21 in such a way that the silicon film 33 is directed upward, and the contact between the SOI device wafer and the pipe is sealed with the O-ring 22. Then, the volume formed by the pipe 21 and the silicon film 33 is filled with a base silicon etching solution 23, and bias voltage is applied through the platinum electrode 24 into the etch apparatus in such a way that the etchant 23 serves as an anode while the substrate 11 becomes a cathode. In this embodiment of the present invention, a mixture solution of ethylene diamine, pyrocatechol and water which is warmed to 50° C. is adopted as an etchant and a bias of 50 volts is applied. According to this method, the material from the silicon film 33 is etched away to an appropriate depth to produce a very thin silicon film 35 as shown in FIG. 4C.

Figure 4D:
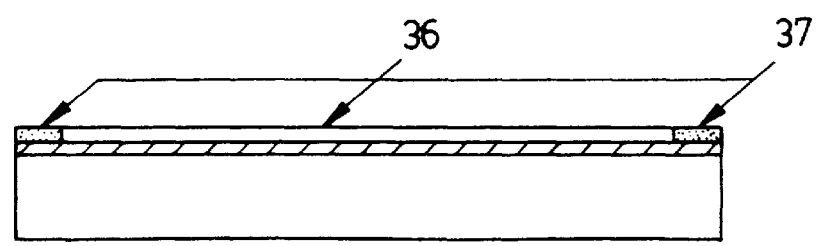

Excessive thinness of the silicon thin film of the SOI wafer obtained can be overcome by growing an epitaxial silicon layer on the wafer into a desired thickness of a silicon thin film 36, as shown in FIG. 4D. In this case, because the circular buried oxide layer is partly exposed along the brink of the wafer to a width of about 500 microns to 1 cm, a polycrystalline silicon film 37 is circularly made on the exposed area of the buried oxide layer.

Figure 5A:
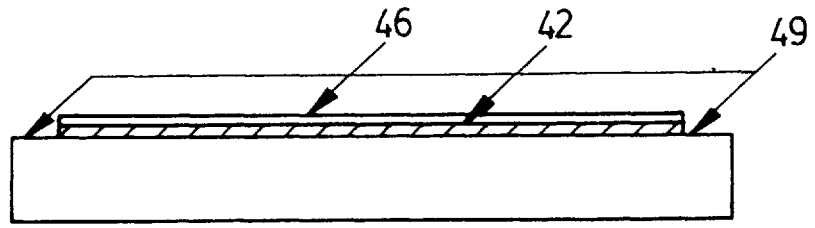
FIGS. 5A through 5C are schematic cross sectional views showing various SOI device wafer structures according to the present invention.

FIG. 5 shows various cross sectional structures of SOI wafer which can be fabricated according to the present invention. The SOI wafer shown in FIG. 5A has a thin oxide film 46, has a buried oxide film 42, and has a substrate 49 whose circumferential stretch is exposed to give a circular stripe in the top view to a width of about 500 microns to 1 cm. This structure can be made by removing the exposed area of the buried oxide layer 42 of the SOI wafer shown in FIG. 1E or 4C.

Figure 5B:
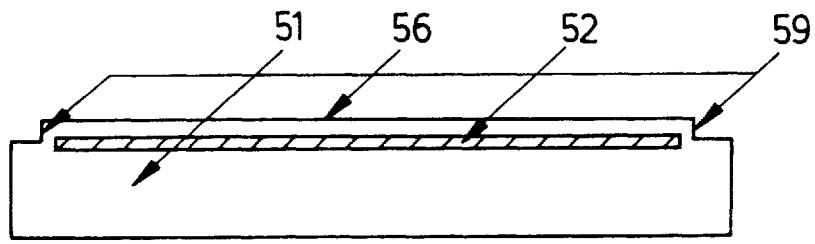

With reference now to FIG. 5B, there is shown another structure of SOI wafer according to the present invention. In this structure, a stretch of a buried oxide layer 52 is cut off along its circumference, wherein the circumference is about 500 microns to 1 cm apart from the brink of the silicon substrate, and the oxide layer is closely surrounded by a silicon film 56, a substrate 51 and a silicon film 59. Such structure of SOI wafer can be obtained by growing an epitaxial silicon layer on the SOI wafer of FIG. 5A.

Figure 5C:
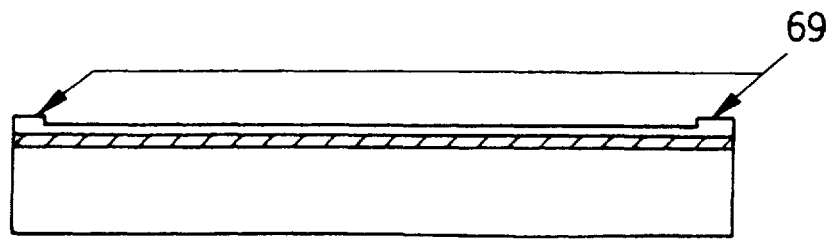

Turning now to FIG. 5C, a silicon thin film with a single crystal structure has a circumferential protruded portion 69 along its brink to a width of about 500 microns to 1 cm. This SOI device wafer structure can be obtained by applying the bias technique of FIG. 2 to the SOI wafer of FIG. 1C or 4A. This circumferential protruded portion is attributed to the fact that, as mentioned above, the silicon film within the pipe 21 is etched with the chemical etchant to some depth by applying a bias but the silicon film outside and on the pipe is by no means etched because it is not in contact with the chemical etchant threat. Of course, an epitaxial silicon layer may grow on this structure of SOI wafer.

As described hereinbefore, the SOI wafers according to the present invention comprise a monocrystalline silicon thin film with a highly uniform thickness formed on a thick buried oxide layer and are certain to show good interface characteristics between the silicon thin film and the buried oxide layer. They are attributed absolutely to the bonding and bias techniques according to the present invention. Consequently, the very large scale integration of complex circuitry on a single chip and the superior characteristics of electronic devices can be accomplished by the present invention.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A bias method for forming a thin monocrystalline silicon film on an insulator, comprising the steps of:

preparing an etch apparatus comprising an etch vessel, an electrode and a power source, said etch vessel formed by attaching a monocrystalline silicon film on an insulator device wafer to the bottom of a sealed pipe;

contacting a base silicon etching solution with said monocrystalline silicon film in said etch vessel; and etching said monocrystalline silicon film to an appropriate depth by applying a bias through said electrode to said etch apparatus with an anode of said etching solution and a cathode of the substrate of said silicon on insulator device wafer, so as to leave a uniformly thin monocrystalline film, which is charged with vacancies during the application of the bias.

2. A bias method in accordance with claim 1, wherein said base silicon etching solution is a mixture solution of ethylene diamine, pyrocatechol and water.

3. A bias method in accordance with claim 1, wherein said thin monocrystalline film has a uniform thickness of 20 nanometers or less.

4. A bias method in accordance with claim 1, further comprising the step of growing an epitaxial silicon layer on said uniformly thin silicon film.

5. A bias method for fabricating a silicon on insulator device wafer, comprising the steps of.

bonding a non-treated lower silicon wafer with an upper silicon wafer the entire surface of which is coated with an oxide;

subjecting said upper silicon wafer to mechanical polishing or chemical etching to several tens of microns or less, to produce a silicon on insulator structure which comprises a silicon film having a thickness of several tens of microns or less, a silicon substrate and a buried oxide layer therebetween;

removing a stretch of the silicon film along the brink of said silicon on insulator structure, to expose a circumferential stripe of said buried oxide layer;

preparing an etch apparatus comprising an etch vessel, an electrode and a power source, said etch vessel formed by attaching said cut silicon film to the bottom of a sealed pipe;

contacting a base silicon etching solution only with said silicon film by filling it in said vessel; and etching said silicon film to an appropriate depth by applying a bias through said electrode to said etch apparatus with an anode of said etching solution and a cathode of the substrate of said silicon on insulator structure, so as to leave a uniformly thin monocrystalline silicon film, which is charged with vacancies during the application of bias.

6. A bias method in accordance with claim 5, wherein said circumferential stripe of said buried oxide layer has a width ranging from about 500 microns to about 1 centimeter.

7. A bias method in accordance with claim 5, further comprising the step of growing an epitaxial silicon layer on said uniformly thin silicon film.

8. A bias method for fabricating a silicon on insulator device wafer, comprising the steps of:

removing a stretch of a silicon thin film from an ordinary silicon on insulator structure consisting of the silicon thin film, a substrate and a buried oxide layer therebetween, along its brink, so as to expose a circumferential stripe of said oxide layer;

preparing an etch apparatus comprising an etch vessel, an electrode and a power source, said etch vessel formed by attaching said cut silicon thin film to the bottom of a sealed pipe;

contacting a base silicon etching solution only with said silicon thin film by filling it in said vessel; and etching said silicon film to an appropriate depth by applying a bias through said electrode to said etch apparatus with an anode of said etching solution and a cathode of the substrate of said silicon on insulator structure, so as to leave a uniformly thin silicon film, which is charged with vacancies during the application of bias.

9. A bias method in accordance with claim 8, wherein said exposed circumferential stripe of said oxide layer has a width ranging from about 500 microns to about 1 centimeter.

10. A bias method in accordance with claim 8, further comprising the step of growing an epitaxial silicon layer on said uniformly thin silicon film.

\* \* \* \* \*